United States Patent
Besling et al.

(10) Patent No.: US 9,105,479 B2
(45) Date of Patent: Aug. 11, 2015

(54) INTEGRATED CIRCUIT INCLUDING AN ENVIRONMENTAL SENSOR

(71) Applicant: NXP B. V., Eindhoven (NL)

(72) Inventors: Willem Frederik Adrianus Besling, Eindhoven (NL); Martien Kengen, Boxmeer (NL)

(73) Assignee: ams International AG, Rapperswil-Jona (CH)

(*) Notice: Subject to any disclaimer, the term of this patent is extended or adjusted under 35 U.S.C. 154(b) by 0 days.

(21) Appl. No.: 14/018,484

(22) Filed: Sep. 5, 2013

(65) Prior Publication Data

US 2014/0070337 A1    Mar. 13, 2014

(30) Foreign Application Priority Data

Sep. 11, 2012 (EP) .................................. 12183896

(51) Int. Cl.
| | | |
|---|---|---|
| *H01L 23/04* | (2006.01) | |
| *B81B 7/00* | (2006.01) | |
| *H01L 23/31* | (2006.01) | |
| *H01L 21/50* | (2006.01) | |
| *H01L 21/77* | (2006.01) | |

(52) U.S. Cl.
CPC .............. *H01L 23/04* (2013.01); *B81B 7/0061* (2013.01); *H01L 21/50* (2013.01); *H01L 21/77* (2013.01); *H01L 23/3114* (2013.01); *B81B 2201/0264* (2013.01); *H01L 2924/0002* (2013.01)

(58) Field of Classification Search
CPC ..... H01L 21/77; H01L 21/50; H01L 21/6732; H01L 23/3114; H01L 23/04; H01L 23/3115; H01L 2924/0002; H01L 2924/00; B81B 7/0061; B81B 7/0073; B81B 2201/0264; B81B 2201/0278; B81B 2201/05
USPC .............. 257/415, 414, 417, 467; 438/50, 51, 438/270
See application file for complete search history.

(56) References Cited

U.S. PATENT DOCUMENTS

| | | | |
|---|---|---|---|
| 6,465,281 | B1 * | 10/2002 | Xu et al. ......................... 438/127 |
| 2006/0154401 | A1 * | 7/2006 | Gardner et al. .................. 438/53 |
| 2007/0278601 | A1 * | 12/2007 | Goodelle et al. ............... 257/416 |
| 2008/0080832 | A1 | 4/2008 | Chen et al. |
| 2009/0256216 | A1 | 10/2009 | Kierse |

(Continued)

FOREIGN PATENT DOCUMENTS

| | | |
|---|---|---|
| EP | 1 775 259 A1 | 4/2007 |
| JP | 2010 177351 A | 8/2010 |

OTHER PUBLICATIONS

Anthony, C.J., et al; "Microfabrication in Foturna ™ Photosensitive Glass Using Focused Ion Beam"; Proceedings fo the World congress on Engineering 2007, vol. II; WCE 2007, London, U.K.; 5 pages (2007).

(Continued)

*Primary Examiner* — Nikolay Yushin
(74) *Attorney, Agent, or Firm* — McDermott Will & Emery LLP

(57) ABSTRACT

An integrated circuit and a method of making the same. The integrated circuit includes a semiconductor substrate including at least one environmental sensor. The integrated circuit also includes a cap layer located on a major surface of the substrate. The integrated circuit further includes at least one elongate channel for allowing access of said sensor to an environment surrounding the integrated circuit.

12 Claims, 8 Drawing Sheets

(56) References Cited

U.S. PATENT DOCUMENTS

2010/0052082 A1* 3/2010 Lee et al. .................. 257/416
2012/0018827 A1 1/2012 Kestelli et al.
2012/0161256 A1* 6/2012 Grudin et al. ............. 257/415

OTHER PUBLICATIONS

Borrelli, N. B., et al; "Photolytic technique for producing microlenses in photosensitive glass"; Applied Optics, vol. 24, No. 16; 9 pages (Aug. 15, 1985.
Cheng, Ya, et al; "Microfabrication of 3D hollow structures embedded in glass by femtosecond laser for Lab-on-a-chip applications"; Science Direct, Applied Surface Science 248, pp. 172-176 (2005).
Ruf, A., et al; "Ultra-long glass tips for atomic force microscopy"; Journal of Micromechanics and Microengineering—Structures, Devices and Systems, vol. 6, No. 2; 10 pages; (Jun. 1996).
Dietrich, T.R., et al; "Fabrication technologies for Microsystems utilizing photoetchable glass"; Elsevier, Microelectronic Engineering 30, pp. 497-504 (1996).
Dietrich, T.R., et al; "Photoetchable glass microsystems: tips for atomic force microscopy"; Journal of Micromechanics and Microengineering—Structures, Devices and Systems, vol. 3, No. 4 (Dec. 1993).
Helvajian, Henry, et al; "Laser microprocessing for nanosatellite microthruster applications"; Riken Review, No. 32; 10 pages (Jan. 2001).
Hulsenberg, D., et al; "Glasses and glass-ceramics for application in micromechanics"; Journal of Non-Crystalline Solids 129; pp. 199-205 (1991).
Kim Joohan, et al; "Fabrication of microstructures in photoetchable glass ceramics using excimer and femtosecond lasers"; Journal of Microlithography and Microsystems, 3(3); pp. 478-485 (2004).
Livingston, F.E., et al; "Variable UV laser exposure processing of photosensitive glass-ceramics: maskless micro-to meso-scale structure fabrication"; Applied Physics A, vol A81, No. 5; pp. 1569-1581 (Oct. 2005).
Smith, G. P.; "Some light on glass"; Glass Technology vol. 20, No. 4; pp. 149-157 (Aug. 1979).
Cheng, Ya, et al; "3D Microstructuring Inside Foturan Glass by Femtosecond Laser"; Riken Review No. 50; 6 pages (Jan. 2002).
Extended European Search Report for Application 12183896.5 (Feb. 19, 2013).
Communication pursuant to Article 94(3) EPC for application 12 183 896.5 (Dec. 11, 2013).

* cited by examiner

INTEGRATED CIRCUIT INCLUDING AN ENVIRONMENTAL SENSOR

CROSS-REFERENCE TO RELATED APPLICATIONS

This application claims the priority under 35 U.S.C. §119 of European patent application no. 12183896.5, filed on Sep. 11, 2012, the contents of which are incorporated by reference herein.

BACKGROUND OF THE INVENTION

This invention relates to an integrated circuit. In particular, this invention relates to an integrated circuit including at least one environmental sensor. The invention further relates to a method of making such an integrated circuit.

Nowadays, integrated circuits may comprise a plethora of different sensors, such as ambient light (AL) sensors, temperature (T) sensors, pressure sensors, gas sensors, relative humidity (RH) sensors, specific analyte detection sensors, and so on.

Integrated circuits of this kind have a wide range of applications. For example, they can be used in the field of supply chain management to track and monitor the freshness of food and beverages. They can also be used as environmental sensors, for example as part of a heating, ventilation and air conditioning (HVAC) system in an automobile or in a building (e.g. a Smart Building). Additional applications include those in agricultural (e.g. the sensing of environmental conditions in greenhouses) or in medical fields. Their provision in mobile communications devices such as mobile telephones, tablets or laptops can also enable a wide range of further applications that require measurements of local environmental factors.

The provision of sensors in integrated circuits of this kind allows devices to be produced that have a small form factor. For example, due to their small form factor, integrated circuits incorporating one or more sensors can be included in Radio Frequency Identification (RFID) tags, allowing for easy programming and readout.

Moreover, it allows large numbers of sensors to be manufactured cheaply, using established semiconductor processing techniques.

An example of an integrated circuit including an environmental sensor is illustrated in FIG. 1A. FIG. 1B shows a cross section of the integrated circuit shown in FIG. 1A.

The integrated circuit includes a semiconductor substrate 2 having a major surface 10. The environmental sensor 6 is provided on the major surface 10. Other components may typically also be proved in the substrate 2, such as memory 14, control circuitry 16 and an analogue to digital converter (ADC) 18. Additionally, a number of bond pads can be provided on the major surface 10, to allow connections to be made to the substrate 2 using traditional wire bonding processes.

The integrated circuit further includes an encapsulant 4. The encapsulant 4 takes the form of a protective layer that encloses the substrate 2, covering most of the major surface 10. As shown in FIG. 1, the encapsulant 4 covers features such as the memory 14, control circuitry 16 and ADC 18. However, environmental sensors such as pressure sensors or gas sensors require direct access to the environment surrounding the integrated circuit to perform their sensing function. For this reason, the environmental sensor 6 is located in an opening 8 which is provided in the encapsulant 4.

The encapsulant 4 can be formed on the substrate 2 using a process known as foil assisted moulding (FAM). In this process, a pattern covered with a foil is pressed down over the major surface 10 of the substrate 2. Encapsulant 4 is then injected into the space around the substrate, including the area between the foil and the major surface 10. The pattern is profiled to allow the encapsulant 4 to cover substantially all of the major surface 10, while leaving an opening 8 at a position corresponding to the environmental sensor 6.

This approach to packaging an integrated circuit including an environmental sensor suffers from a number of disadvantages. For example, when using the foil assisted moulding process, it is difficult to control the exact position of the opening 8. Because of this lack of positional accuracy, a relatively large portion of substrate cannot be used. Also, since the environmental sensor 6 is left exposed throughout the manufacturing process, delicate features of the sensor (such as the deflectable membrane of a pressure sensor or the suspended resistive wire of a thermal conductivity based $CO_2$ sensor) may be damaged. These delicate features may particularly be damaged during the FAM process, during which the substrate 2 and the components provided thereon are subjected to high levels of physical stress. Damage may also occur after manufacture. Moreover, since the environmental sensor is completely exposed, it is prone to an accumulation of dust entering the opening 8.

Packages formed using the above described process are also typically expensive and are also physically large, owing in part to the large form factor of the encapsulant 4 and the large casing in which the encapsulated substrate 2 is mounted.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided an integrated circuit. The integrated circuit includes a semiconductor substrate including at least one environmental sensor. The integrated circuit also includes a cap layer located on a major surface of the substrate. The integrated circuit further includes at least one elongate channel for allowing access of said sensor to an environment surrounding the integrated circuit.

According to another aspect of the invention, there is provided a method of making an integrated circuit. The method includes forming at least one environmental sensor on a semiconductor substrate. The method also includes placing a cap layer on a major surface of the semiconductor substrate. The method further includes forming at least one elongate channel, to allow access of said sensor to an environment surrounding the integrated circuit.

The provision of a cap layer on the major surface allows the environmental sensor to be protected from the surrounding environment (e.g. physical damage or the accumulation of dust). If further components are also located on the major surface (e.g. control circuitry or an ADC), the cap layer can protect those components also.

The provision of at least one elongate channel allows the environmental sensor access to the surrounding environment. Accordingly, the environmental sensor can be provided with physical protection, while still having the access required to function correctly. In contrast to configurations where the environmental sensor located in a large opening (FIGS. 1A and 1B are an example of this), the elongate configuration of the channel increases the degree of physical protection while also providing a degree of protection against materials such as dust reaching the sensor.

Various configurations for the at least one elongate channel are envisaged. In some examples, an elongate channel can be provided that pass through the cap layer. In other examples an elongate channel can be provided that pass through the substrate that includes the at least one sensor.

In a further example, an elongate channel can be provided that extends along an interface between the semiconductor substrate and the cap layer. For instance, the channel could be formed in the major surface of the substrate or on an underside of the cap layer so that when the substrate and cap lay are bonded together, a channel is formed that extends along the interface and terminates at an edge of the integrated circuit. In such examples, during manufacture, the channel openings at the edges of the integrated circuits can be revealed upon singulation (dicing) of a larger wafer.

During manufacture, the elongate channel can be formed either before or after the cap is placed on the major surface. In some examples, the cap is placed on the major surface of a semiconductor wafer as part of a larger capping wafer. The stacked wafers can then be singulated to form a plurality of integrated circuits of the kind described above.

It is also envisaged that combinations of the channel configurations noted above can be used, so that an integrated circuit having multiple such elongate channels could include one or more channels that pass through the substrate and/or the cap layer and/or one or more channels that extend along an interface between the semiconductor substrate and the cap layer.

In accordance with an embodiment of the invention, the cap layer can include at least one cavity that adjoins an area of the major surface in which at least one environmental sensor is located. The provision of such a cavity can allow the cap to be formed in such a way that it need not come into contact with the environmental sensor, which may damage the sensor, and which may also inhibit normal operation of the sensor. During manufacture, the cavity can be formed before the cap is placed on the major surface. For example, where the cap layer is placed as part of a larger capping wafer onto a semiconductor as described above, a plurality of cavities can be provided in the capping wafer at the appropriate positions to align with the environmental sensors of each singulated die.

In some examples, the cap layer can include a plurality of the cavities, each cavity adjoining a respective area of the major surface in which at least one environmental sensor is located. In this way, separate cavities can be created, each cavity housing one or more sensors. This would allow certain kinds of sensor to be housed separately, and the configuration of each cavity (size, shape, number of connecting elongate channels) can then be tailored to the kind of environmental sensor provided therein.

Examples of environmental sensors that may be included in the substrate in accordance with embodiments of this invention includes pressure sensors, gas sensors (e.g. $CO_2$), flow sensors, humidity sensors and pH sensors. These sensors require direct physical access to the surrounding environment in order to perform their sensing function. Nevertheless, other forms of sensor may additionally be provided. Examples of such sensors include temperature sensors, light sensors, magnetometers and accelerometers.

In one embodiment, the environmental sensor is a pressure sensor having a deflectable membrane. Pressure sensors of this kind are highly susceptible to damage and dust, owing to the delicate nature of the membrane. The presence of unwanted materials (e.g. dust) on the membrane can prevent correct operation of such a sensor. The pressure sensor in this example can be provided with access to the surrounding environment through the at least one elongate channel. One or more further environmental sensors can also be provided on the substrate to allow multi-mode sensor operation (e.g. pressure and fluid flow detection, pressure and gas (e.g. $CO_2$) detection, or pressure and ambient light level detection, etc.). The further environmental sensors can, where required, be provided with access to the surrounding environment with one or more elongate channels.

Components provided on the major surface of the substrate may be sensitive to light passing through the cap layer. A particular example of such a component is a temperature sensor. Light falling on such a sensor can cause band gap shift in the materials used in the temperature sensor, leading to erroneous readings or to malfunction. On the other hand, it may be necessary to allow some light to pass through the cap layer, so that a light sensor can sense ambient light conditions. According to an embodiment of the invention, the cap layer can have portions that are substantially transparent to allow light to reach an ambient light sensor located in the substrate, while other portions of the cap layer can be substantially opaque to prevent light reaching a temperature sensor located in the substrate.

In one embodiment, the cap layer can comprise a glass. Such a material is rigid enough to provide adequate physical protection for the components provided on the semiconductor substrate. The glass can be selected to have similar thermal expansion characteristics to the material (typically silicon) used to form the substrate. Certain kinds of glass can be microstructured using a process involving illumination with a laser, followed by a wet etch to remove the illuminated parts. This allows the possibility of forming the channels and cavities described above. An example of such a glass, and the process that can be used, is described by Cheng et al. in an article entitled "3D Microstructuring Inside Foturan Glass by Femtosecond Laser", published in RIKEN Review No. 50 (January, 2003): *Focused on* Laser Precision Microfabrication (LPM 2002), pp. 101-106.

In another embodiment the cap layer can be formed from a second semiconductor substrate. The second substrate can comprise the same material as the first substrate (e.g. Si) so as to provide optimal matching of similar thermal expansion characteristics. The second substrate can be patterned using standard lithographic etching techniques for producing features such as the at least one elongate channel and/or the at least one cavity that adjoins an area of the major surface. The second substrate can, for example, be attached to the semiconductor substrate including the at least one environmental sensor using techniques such as fusion bonding or eutectic bonding. These techniques can allow for airtight connections to be made between the two substrates.

To enhance the ability of the elongate channels to prevent the unwanted incursion of dust, at least some of the elongate channels described above can include one or more corners. This can prevent direct line of sight access from the surrounding environment to the major surface of the substrate.

The cap layer can cover substantially the whole of the major surface. This allows the cap layer to be placed as a monolithic block, and facilitates manufacture of the integrated circuit as part of a larger wafer in which many such circuits are created prior to singulation.

The cap layer can be metallized. For example, the cap layer can be coated with an Electromagnetic Interference (EMI) shield layer. Such a layer can comprise a metal layer applied either to an upper or lower surface of the cap layer. Metallization of this kind may also be used to route electrical connections from vias passing through the cap layer as described herein to bond pads located on top of the cap layer. For example, in one embodiment the cap layer can be metallised and patterned into a coil having windings, passings, and routing on both sides of the cap layer. The coil can be used as antenna for RFID tags having an integrated environmental sensor.

In one example, elongate channel can be connected to, or form part of a microfluidic channel system. In this way, an integrated circuit of the kind described herein can be used in, for example, chemical or biological sensing applications.

The substrate including the at least one environmental sensor can include further components. For example, the substrate can include a plurality of CMOS components forming read-out circuitry for the at least one environmental sensor. The at least one environmental sensor may be formed during back end of line (BEOL) processing, and may incorporate metal features of a metallization stack located on the substrate. In such examples, the sensor can be located within the metallization stack itself or alternatively above the metallization stack (e.g. outside a passivation stack located on the metallization stack).

According to a further aspect of the invention, there can be provided a chip scale package (CSP) including an integrated circuit of the kind described above, wherein the cap layer includes an array of vias containing electrically conductive material for connection of a plurality solder balls to a plurality of corresponding bond pads located on the major surface of the substrate In one embodiment, there can be provided a Radio Frequency Identification (RFID) Tag including an integrated circuit or chip scale package of the kind described above.

In another embodiment, there can be provided a mobile communications device including an integrated circuit or chip scale package of the kind described above.

In a further embodiment, there can be provided a heating, ventilation and air conditioning (HVAC) system including one or more integrated circuits or chip scale packages of the kind described above.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings.

Figure 1A:
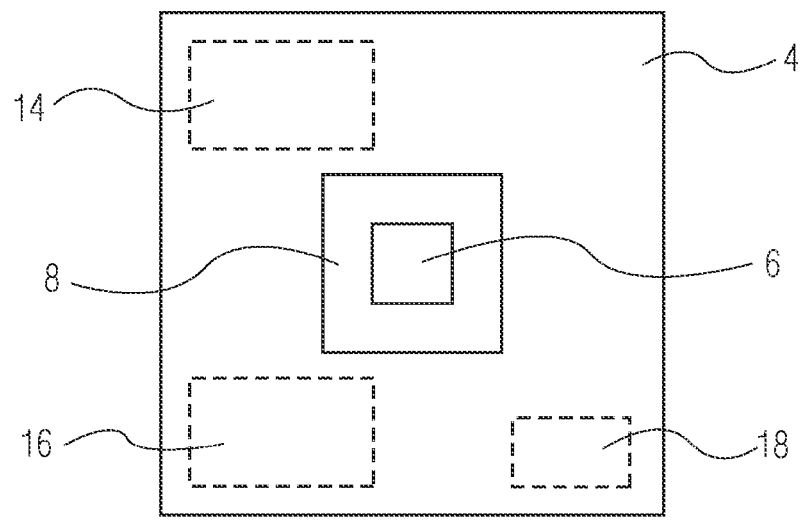
FIGS. 1A and 1B show an example of an integrated circuit including an environmental sensor.
Figure 1B:
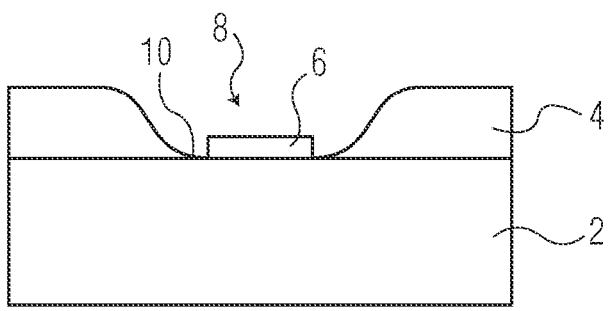
Figure 2:
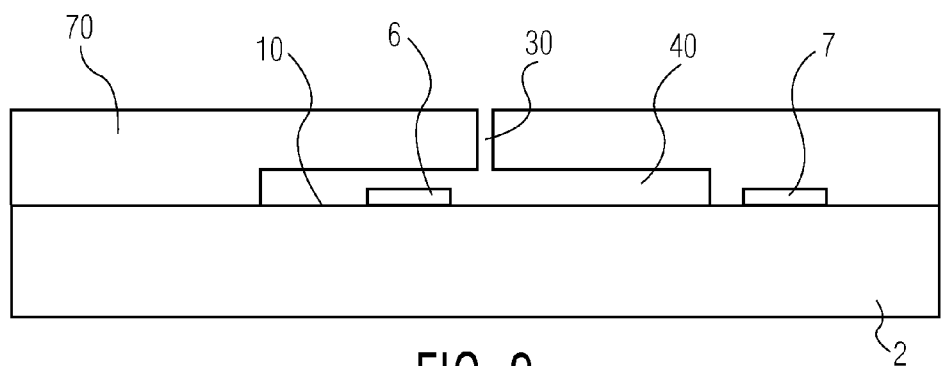
FIGS. 2 to 9 and FIG. 11 each show cross section views of integrated circuits according to an embodiments of the invention.

A first example of an integrated circuit in accordance with an embodiment of the invention is illustrated in FIG. 2. The integrated circuit includes a semiconductor substrate 2, which may comprise, for example, silicon. The semiconductor substrate 2 has a major surface 10. An environmental sensor 6 is provided on the major surface 10. The environmental sensor 6 is a sensor that requires direct physical access to the environment surrounding the integrated circuit in order correctly to perform its sensing function. Examples of such sensors include pressure sensors, gas sensors (for example $CO_2$ sensors) humidity sensors, and pH sensors.

In addition to the environmental sensor 6, further components can also be provided in the semiconductor substrate 2. For example, there can be provided control circuitry for operating the environmental sensor 6, memory for storing readings taken by the environmental sensor 6, an analogue to digital converter (ADC) for converting readings taken by the environmental sensor 6 into the digital domain, and/or a microprocessor to perform calculations. For the purposes of clarity, these further components are not illustrated in the example of FIG. 2.

Additionally, further sensors can be provided in the substrate 2. For example, environmental sensors which themselves do not require direct physical access to the surrounding environment can be provided. An example of such a sensor 7 is illustrated in FIG. 2. It will be appreciated that because these kind of sensor do not require direct physical access to the surrounding environment, they need not necessarily be provided with an elongate channel of the kind described below.

In accordance with an embodiment of the invention, a cap layer 70 is provided on the major surface 10 of the substrate 2. The cap layer 70 provides physical protection for components provided on the major surface 10 of the substrate 2. As such, the cap layer 70 can provide physical protection for the environmental sensor 6. In the present example, the cap layer 70 also provides physical protection for the additional sensor 7.

To allow the environmental sensor 6 direct physical access to the surrounding environment, an elongate channel 30 is provided, which in the present example passes through the cap layer 70. The elongate channel can, for example, allow fluids such as gasses to reach the environmental sensor 6. The environmental sensor 6 can thereby perform its sensing function, such as determining the composition of a gas or the pressure of the gas. As noted in more detail below, the provision of multiple channels of this kind is envisaged. It is further envisaged that the channels may in a network including one or more branches.

In the present example, the cap layer 70 has an underside that is profiled to form a cavity 40 that adjoins the major surface 10 of the substrate 2. The environmental sensor 6 is located in the cavity 40. The elongate channel 30 connects the cavity 40 to the surrounding environment.

The provision of a cavity 40 of this kind allows the cap layer 70 to be placed onto the major surface 10 of the substrate 2 in a manner that prevents an underside of the cap layer 10 touching the environmental sensor 6. Contact between the cap layer 70 and the environmental sensor 6 may damage the environmental sensor 6, and may in any case prevent normal operation of the environmental sensor 6. The surface area over which the environmental sensor 6 must be exposed for correct operation may in some examples exceed the cross-sectional area of the elongate channel 30—in such examples, the cavity 40 also acts to ensure that the environmental sensor 6 remains functional.

In some examples, the cap layer 70 can comprise a photo-etcheable glass. This kind of material may be particularly suitable for forming a cap layer 70 of the kind described herein, owing to the ease with which micro-structuring of the various features of the cap layer (such as the elongate channel 30 and the cavity 40) can be performed. However, the use of this kind of glass material (such as that described by Cheng et al) is not considered to be essential and other examples are envisaged.

In another embodiment the cap layer can be formed from a second semiconductor substrate comprising, for example, Si. In such examples, the thermal expansion coefficients of the two substrates can be substantially equal, avoiding stresses within the substrates and at the interface between the two substrates caused by changes in ambient temperature.

To produce the features of the cap layer such as the one or more elongate channels and/or the at least one cavity that adjoins an area of the major surface of the first substrate (the "first" substrate being the substrate that includes the at least one environmental sensor), the second substrate can be patterned using standard lithographic etching techniques that are generally known in the art of semiconductor manufacturing. In some examples, Techniques such as Deep Reactive Ion Etching (DRIE) can also be used to form these features. These techniques can allow a high degree of control over shape, size and location of the various features.

The second substrate can, for example, be attached to the first semiconductor substrate using techniques such as laser bonding, direct bonding, plasma activated bonding, anodic bonding, eutectic bonding, glass frit bonding, adhesive bonding, thermocompression bonding, or reactive bonding. These techniques can allow can allow for airtight connections to be made between the two substrates. During attachment of the second substrate to the first substrate, parameters such as surface flatness and cleanliness of the interface, the bonding temperature, ambient pressure, and applied pressure can be carefully controlled to ensure that a robust, tight seal is made. Typically, an activation step can be applied when the two substrates are pressed together to allow local melting, inter-diffusion, welding, or reactive bonding at their surfaces. The activation can comprise of a heating step, in a furnace or the use of a focussed laser spot, or an energetic plasma.

An advantage of using a glass is that it is laser bondable at low temperature to the semiconductor substrate. A laser spot (that can be focussed through the transparent glass) can cause only localised heating to make a hermetic seal. This can allow the large temperature budgets that are sometimes required to fuse wafers together to be avoided (for example, for a sensor on top of CMOS, a low overall temperature is particularly desirable).

With reference to FIG. 2, it will be noted that the laminate configuration of the cap layer 70 and substrate 2 affords a compact construction. Moreover, as described in more detail below, since the cap layer 70 can be placed as part of a larger capping wafer onto a semiconductor wafer and then singulated along with the semiconductor wafer, embodiments of this invention can allow for large scale production at low cost.

In the example of FIG. 2, only a single environmental sensor 6 is provided with direct physical access to the surrounding environment. It is noted that in FIG. 2, the sensor 7 does not have direct physical access. Accordingly, the sensor 7 may, for example, comprise a sensor such as a temperature or ambient light sensor.

Figure 3A:
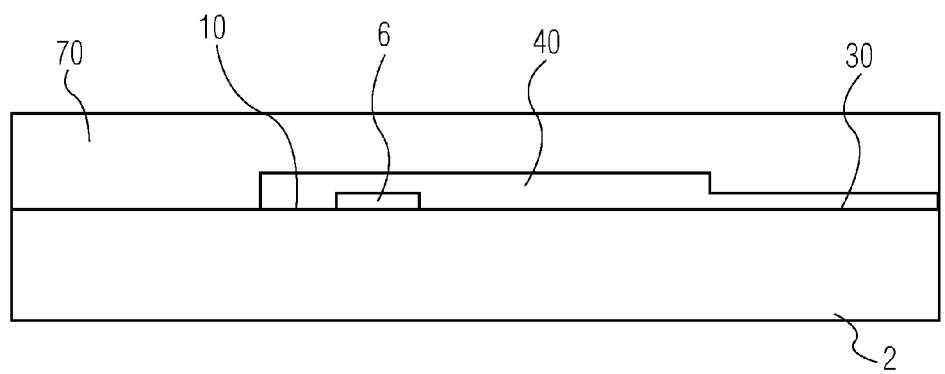
Figure 3B:
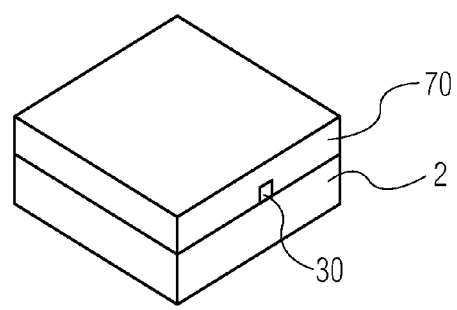

FIGS. 3A and 3B schematically illustrate another example of an integrated circuit according to an embodiment of the invention. In this example, the elongate channel 30 extends along an interface between the semiconductor substrate 2 and the cap layer 70. The channel 30 in such an example can thus extend substantially parallel to the plane of the major surface of the substrate 2.

The channel 30 may be formed from, for example, a trench located on the major surface of the substrate 2. Alternatively, as shown in FIGS. 3A and 3B, the channel may comprise a groove located on an underside of the cap lay 70.

As shown in FIG. 3B, in the present example the channel 30 terminates at an opening at an edge 102 of the integrated circuit. During manufacture, the opening of the channel 30 can be exposed during singulation of a larger wafer, thereby to connect the channel 30 and the environmental sensor to the surrounding environment (see also the description of the singulation step described below in relation to FIG. 14C). In examples where more than one channel 30 of this kind is provided, it is envisaged that the channels 30 may terminate at separate edges of the integrated circuit.

Figure 4:
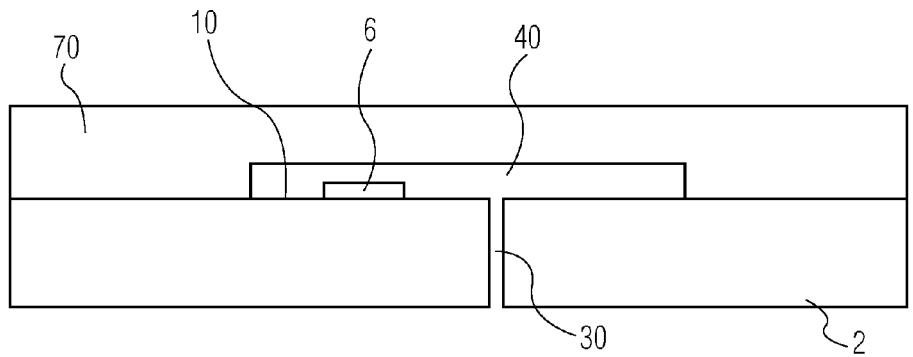

FIG. 4 shows a further example of example of an integrated circuit according to an embodiment of the invention. In this example, the elongate channel is located in the substrate 2. The channel can be etched through the substrate during manufacture using a lithographic masking and etching steps. Similar steps may be used to form one or more elongate channels in the cap layer, where the cap layer comprises a second semiconductor substrate as described below.

Further embodiments of the invention are envisaged, in which more than one environmental sensor is provided with direct physical access to the surrounding environment. A first example of such an integrated circuit is shown in FIG. 5.

Figure 5:
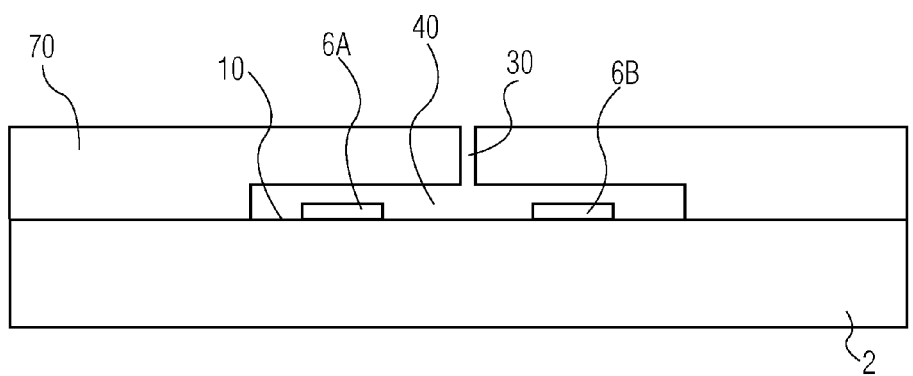

The example in FIG. 5 is similar to that described above in relation to FIG. 2. However, in this example the cavity 40, which is connected to the surrounding environment with a single elongate channel 30, has two separate sensors, 6A and 6B located therein. In the present example, both of these sensors 6A and 6B are environmental sensors that require direct physical access to the surrounding environment. However, in an alternative configuration, one of the sensors may be an environmental sensor requiring direct physical access, while the other sensor may not require such access. Nevertheless, it may be beneficial from a design perspective to co-locate the various sensors in the integrated circuit into a small area (e.g. central to the substrate 2). In such examples, the fact that a sensor not requiring direct physical access to the surrounding environment nevertheless has such access may not necessarily be detrimental to the operation of the sensor.

It is envisaged that in examples including multiple sensors as described in relation to FIG. 5, the elongate channel 30 extends along an interface between the semiconductor substrate 2 and the cap layer 70 (as described in relation to FIGS. 3A and 3B) or may pass through the substrate 2 instead of the cap layer 70 (as described in relation to FIG. 4). Examples including a combination of multiple channels of this kind may also be provided.

Figure 6:
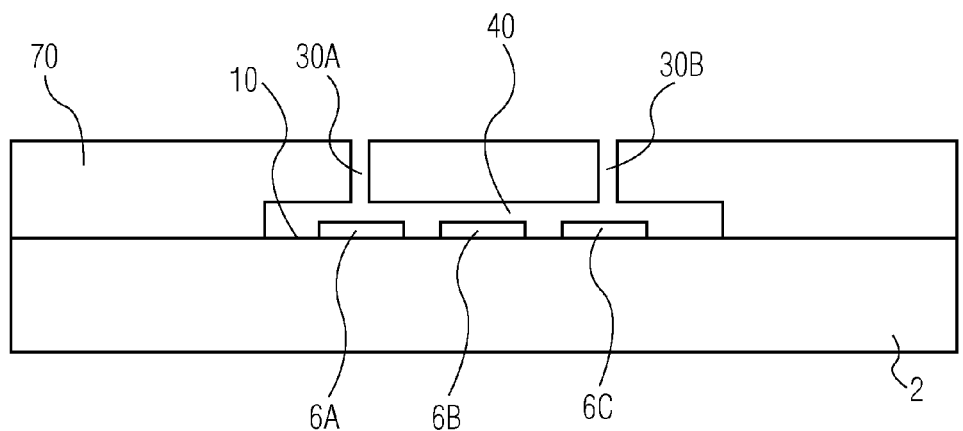

In the example of FIG. 5, both sensors require direct physical access to the surrounding environment, and both sensors gain this access via the single elongate channel 30. FIG. 6 illustrates an example in which more than one elongate channel 30A, 30B is provided.

In FIG. 6, it is illustrated that a plurality of sensors 6A, 6B, 6C, at least some of which require direct physical access to the surrounding environment, are located on the major surface 10 of a substrate 2. In this example, all of the sensors 6A, 6B, 6C are located in a common cavity 40. The cavity 40 is connected to the surrounding environment by two separate elongate channels 30A, 30B.

From the example of FIG. 6, it will be appreciated that any number of sensors may in principle be provided with direct physical access to the surrounding environment using one or more elongate channels through the cap layer 70. The number of elongate channels that are provided can be selected in accordance with design requirements. For example, a single elongate channel may not, on its own, be sufficient to provide the required degree of physical access to the surrounding environment. By providing additional elongate channels, factors such as gas flow to the environmental sensors can be enhanced, and the presence of an unwanted pressure differential between the cavity 40 and the surrounding environment can be mitigated.

It is envisaged that in examples where more than one elongate channel 30 is provided, these channels may also take any of the configurations described above in relation to FIGS. 2, 3A, 3B and 4. Thus, each and any of the plurality of channels may pass through the cap layer 70, or may pass through the substrate 2 instead of the cap layer 70, or may extend along an interface between the semiconductor substrate 2 and the cap layer 70.

Figure 7:
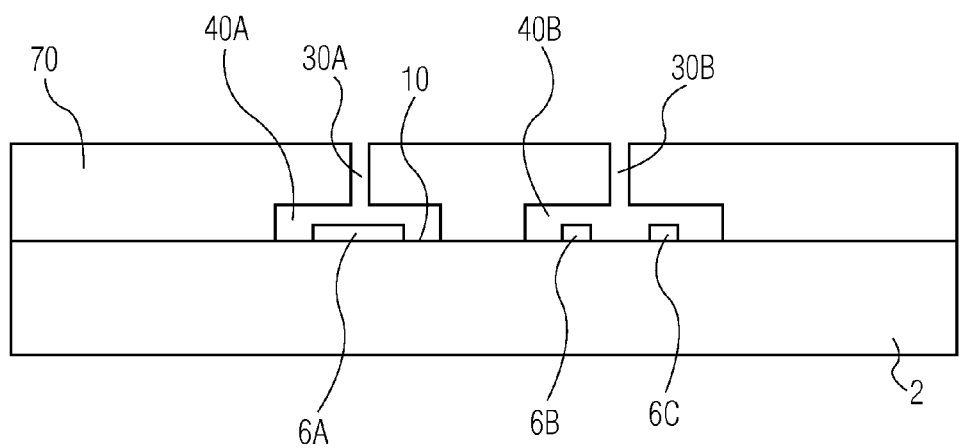

A further example of an integrated circuit is illustrated in FIG. 7. As shown in FIG. 7, it is envisaged that more than one cavity can be provided in the underside of the cap layer 70. The example of FIG. 7 illustrates the particular case where two such cavities 40A, 40B are provided. The first cavity 40A is connected to the surrounding environment with an elongate channel 30A, while the second cavity 40B is connected to the surrounding environment with a second channel 30B. It is also envisaged that, following the example of FIG. 6, one or more of the plurality of cavities may be connected to the surrounding environment with more than one elongate channel. Moreover, it is further envisaged that each of the plurality of cavities can house its own set of one or more sensors. For example, in FIG. 7, it is shown that the cavity 40A includes a single environmental sensor 6A, while cavity 40B includes two sensors 6B, 6C, at least one of which is an environmental sensor that requires direct physical access to the surrounding environment.

In some examples, where multiple cavities are provided, a different configuration for the elongate channels may be selected. Thus, each and any of the channels 30 associated with each cavity 40 may pass through the cap layer 70, or may pass through the substrate 2 instead of the cap layer 70, or may extend along an interface between the semiconductor substrate 2 and the cap layer 70.

In one example, two separate cavities can each house a respective pressure sensor. This can allow a differential pressure sensor to be implemented. In one embodiment of this kind, each cavity can be connected to the surrounding environment with a respective elongate channel. In this way, the two pressure sensors can act as a flow meter, by measuring the pressure differential between them. In another embodiment of this kind, one of the cavities housing a pressure sensor may be sealed, while the other may be connected to the surrounding environment with an elongate channel. This can allow the two sensors to act as a differential pressure sensor, using the reading taken by the pressure sensor in the sealed cavity as a reference point.

As noted above, the provision of an elongate channel passing through the cap layer 70 can provide a degree of protection against the incursion of dust. This degree of protection can be enhanced by providing an elongate channel that extends laterally within the cap layer 70. Such an elongate channel prevents a direct line of sight between the surrounding environment and the major surface 10 of the substrate 2, and thereby acts as a baffle against the incursion of dust. Examples of such elongate channels are illustrated in FIGS. 6 and 7.

Figure 8:
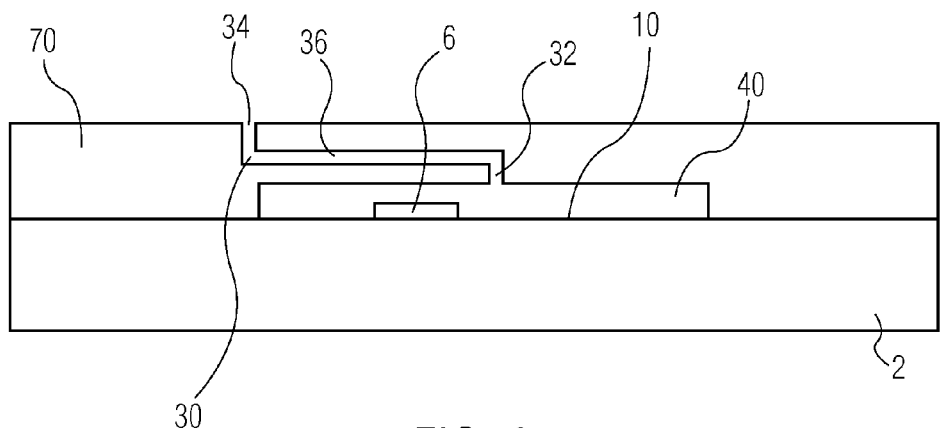
Figure 9:
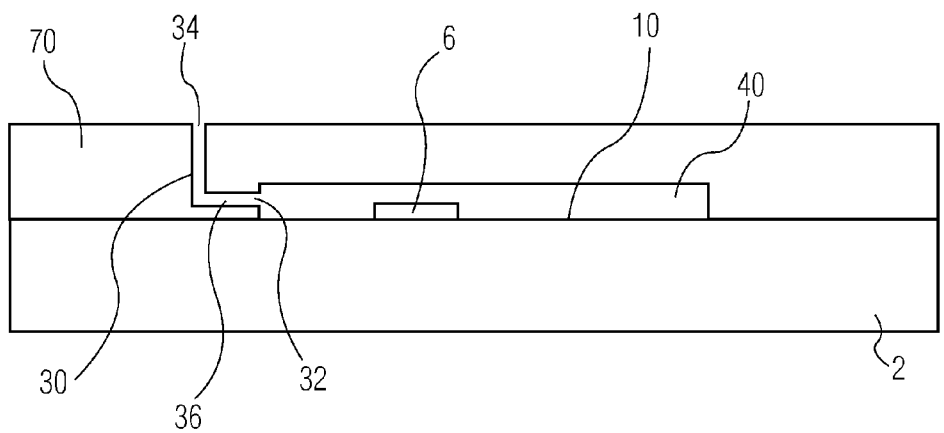

As shown in FIGS. 8 and 9, the elongate channel 30 can include one or more corners. These corners can act as a baffle for preventing an incursion of dust into the integrated circuit, which may damage or at least prevent normal operation of the environmental sensor(s). A first example of this is illustrated in FIG. 8, in which the elongate channel 30 includes a first end 32 that connects to the cavity 40 and a second end 34 that connects to the surrounding environment. A central section 36 of the elongate channel 30 extends laterally within the cap layer 70.

An alternative example of an elongate channel 30 having corners is illustrated in FIG. 9. In the example of FIG. 9, the elongate channel 30 has a first end 32 that connects to the cavity 40 and a second end 34 that connects to the surrounding environment. The elongate channel 30 has a portion 36 that extends laterally within the cap layer.

With reference to the examples of FIGS. 6 and 7, it will be appreciated that only a portion of the elongate channel 30 needs to extend laterally within the cap layer 70 in order to act as a baffle. Moreover, lateral extension within the cap layer 70 is not considered to be restricted to elongate channels that extend substantially parallel to the major surface 10 of the substrate 2 (e.g. sloped or curved channels are envisaged, and the corners need not be sharp).

It is envisaged that corners of the kind described in relation to FIGS. 8 and 9 may also be incorporated into elongate channels 30 that pass through the substrate 2 or that extend along an interface between the semiconductor substrate 2 and the cap layer 70.

Figure 10:
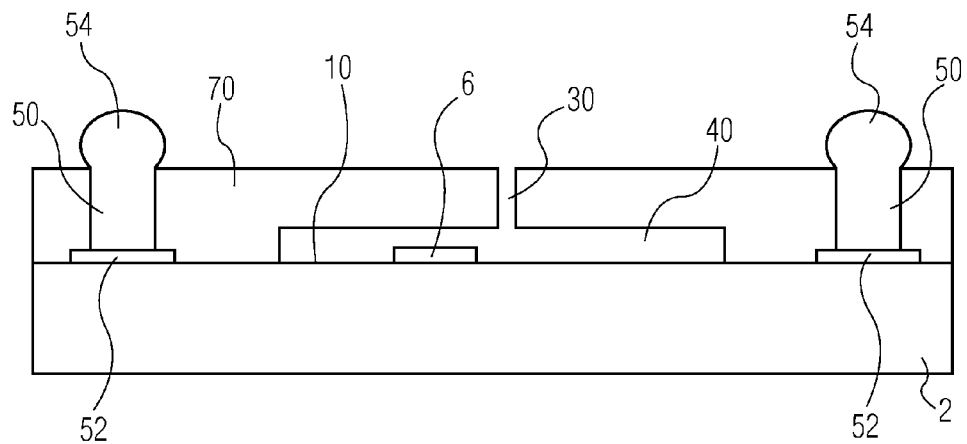
FIG. 10 shows a cross section view of a chip scale package according to an embodiment of the invention.

A further embodiment of the invention is illustrated in FIG. 10. In this embodiment the substrate 2 together with the cap layer 70 form a chip-scale package (CSP). As is known in the art of semiconductor packaging, a chip-scale package is a type of integrated chip carrier. Typically these kinds of package have a relatively small form factor, which is comparable in size to the size of the semiconductors substrate involved. Typically, packages of this kind can be surface mounted in a so called flip-chip arrangement. A ball-grid array (BGA) can be used to provide electrical connection between the mounting surface and the substrate 2.

In FIG. 10, the cap layer 70 is provided with one or more solder balls 54 on a topside thereof (in an alternative example, instead of using solder balls, wire bonding could be used to connect to the bond pads 52 through the vias 50). These solder balls 54 can be arranged in a ball grid array configuration. The solder balls 54 can connected to bond pads 52 provided on the major surface 10 of the semiconductor substrate 2 through vias 50 filled with electrically conductive material. Where the cap layer 70 is formed from a second semiconductor substrate, the vias 50 can be provided as through silicon vias (TSVs), which are known in the field of semiconductor device manufacture.

In some examples, the electrically conductive material in the vias 50 may be the same material as that used in the solder balls. Indeed, as described in more detail below (see FIGS. 10 to 12) the material in the vias 50 can be formed from solder balls placed on to the vias which are then heated to allow some of the material from the solder balls to sink down in to the vias 50 to connect to the bond pads 52.

Figure 11:
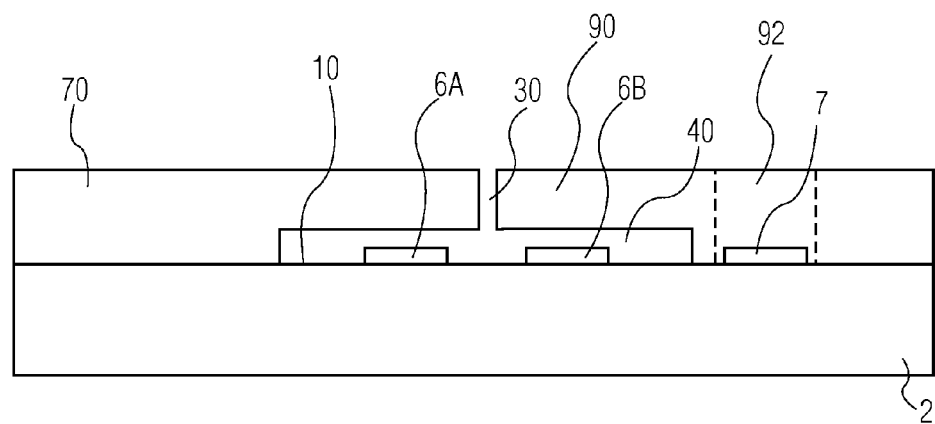

FIG. 11 illustrates a further example of an integrated circuit in accordance with an embodiment of this invention. The example in FIG. 11 is similar to that described above in relation to FIG. 5. However, in this example, the integrated circuit includes a further sensor 7, which comprises an ambient light sensor including one or more photo diodes. For correct operation of the ambient light sensor 7, it is necessary that light must be able to pass through the cap layer 70.

However, it is also desirable in some cases that light is prevented from passing through the cap layer 70. One example of this is the case where a temperature sensor such as one of the environmental sensors 6A and 6B shown in FIG. 11 is provided in the substrate 2. Known temperature sensors provided in semiconductor devices are sensitive to exposure to light. Exposure of this kind can lead to band gap shift within the temperature sensor, causing erroneous readings or malfunction. In the example of FIG. 11, this problem is addressed by providing a substantially opaque cap layer 70 that has a portion 92 that is substantially transparent. The portion 92 is located over the ambient light sensor 7. In this way, the sensors 6A and 6B are shielded against light falling thereon, while the ambient light sensor 7 is able to make an evaluation of ambient light levels.

In some examples, a substantially transparent cap layer 70 can be provided with a generally opaque layer, for example, on an underside or a topside thereof. This opaque layer can be patterned to allow light to pass in certain selected areas. Alternatively, the cap layer 70 may be generally opaque throughout its thickness except, for certain portions such as the portion 92. In the case where the cap layer 70 is provided in the form of a glass cap layer, the glass may be treated (for example using photo-illumination techniques) selectively to form opaque and transparent portions.

In some of the embodiments, the cap layer 70 can be provided with an electromagnetic interference (EMI) shield layer. Such a shield layer can, for example, comprise a metallic coating located either on the underside or a topside of the cap layer. This shield layer can, for example, be applied to the cap layer 70 before the cap layer 70 is placed on to the major surface 10 of the substrate 2.

Figure 12A:
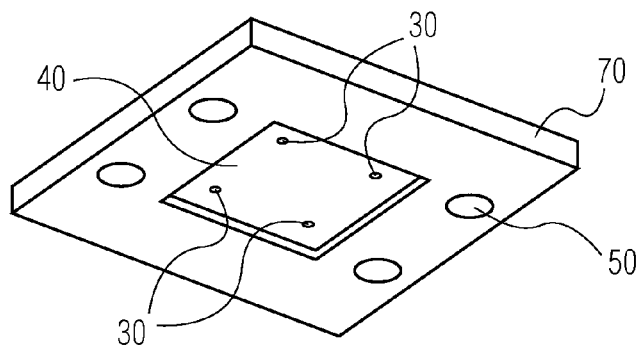
FIGS. 12A and 12B shows a chip scale package according to an embodiment of the invention, in which the cap layer is separated from the substrate to show the major surface of the substrate.
Figure 12B:
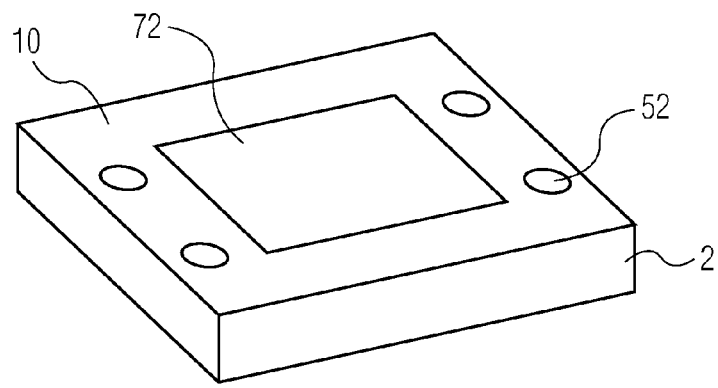
Figure 13:
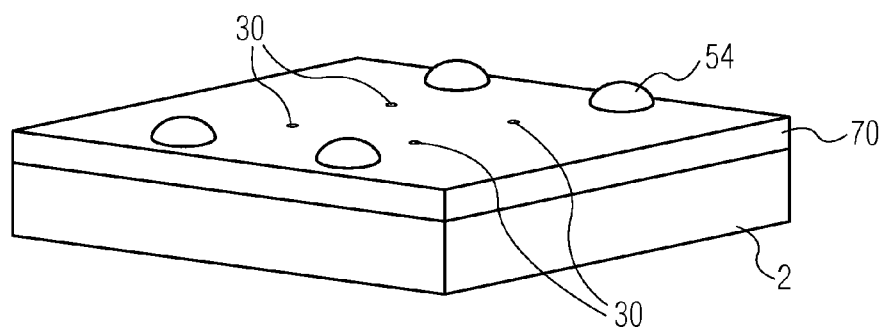
FIG. 13 shows the chip scale package of FIG. 10, with the cap layer placed on the substrate.

FIGS. 12 and 13 illustrate a further example of a chip-scale package in accordance with an embodiment of the invention.

FIG. 12A illustrates the cap layer 70, showing an underside thereof. In this example, a cavity 40 is provided in the underside of the cap layer 70. The cap layer 70 is also provided with four elongate channels 30 that pass through the cap layer 70. These elongate channels 30 connect the cavity 40 to the surrounding environment. The cap layer 70 is also provided with four vias 50. As noted above, in examples where the cap layer 70 is a second semiconductor substrate, these vias 50 can be provided as through silicon vias (TSVs).

As shown in FIG. 12B, the semiconductor conductor substrate 2 in this example has a major surface 10 that has an area 72 within which one or more environmental sensors requiring direct physical access to the surrounding environment can be located. With reference to FIGS. 10A and 10B, it can be noted that the area 72 generally corresponds to the area covered by the cavity 40. Also provided on the major surface 10 are four bond pads 52. Again with reference to FIGS. 10A and 10B, it can be seen that these bond pads 52 are generally positioned to align with the vias 50.

FIG. 13 shows the same example of an integrated circuit with the cap layer 70 placed on the substrate 2. Upper portions of the elongate channels 30 can be seen on the topside of the cap layer 70. Also shown in FIG. 13 are four solder balls 54, which are positioned over the vias 50 which themselves are filled with electrically conductive material.

It is apparent from FIG. 13, the chip-scale package comprising the substrate 2, the cap layer 70 and the ball grid array comprising solder balls 54 is small in form factor and can, for example, be surface mounted in a flip-chip arrangement. Such a semiconductor package is suitable for provision in devices where space is at a premium. Examples of such devices include radio-frequency identification (RFID) tags and mobile communication devices such as mobile phones, laptops or tablets.

In common with all of the embodiments described herein, it is envisaged that the integrated circuits and packages illustrated in FIGS. 10 to 13 may alternatively include elongate channels that pass through the substrate or that extend along an interface between the semiconductor substrate and the cap layer, or indeed a combination of such channels.

FIG. 14 schematically illustrates a number of steps for manufacturing an integrated circuit in accordance with an embodiment of the invention. In particular, FIG. 14 illustrates a method for producing a plurality of chip-scale packages of the kind described above in relation to FIGS. 12 and 13.

In a first step, a semiconductor wafer can be processed using front end of line (FEOL) processing steps to produce a wafer 22 having a series of environmental sensors provided thereon. These sensors are positioned and configured to allow subsequent dicing leading to the formation of a plurality of separate substrates 2 (FIG. 14C), each incorporating the required number and type of environmental sensor. At this stage, other components required can also be provided (such as control circuitry, ADCs, etc.).

A capping wafer 77 can then be placed onto the wafer 22. The capping wafer 77 can be bonded on to the wafer 22 using a suitable process such as those described above.

Figure 14A:
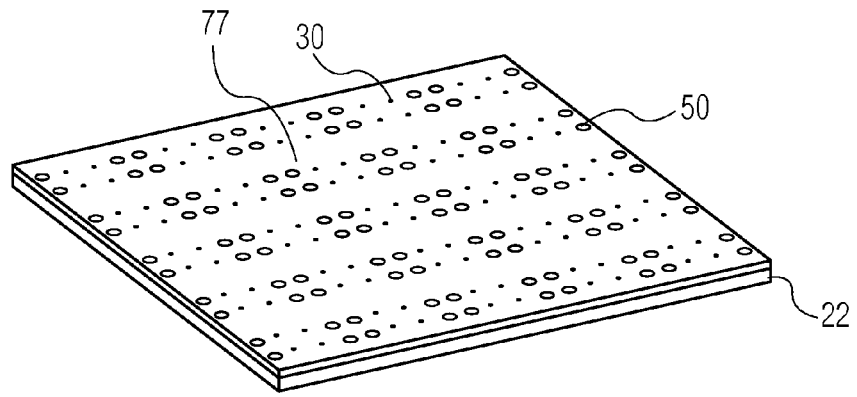
FIGS. 14A to 14C illustrate a number of steps for making a plurality of chip scale packages including integrated circuits according to an embodiment of the invention.

As illustrated in FIG. 14A, the capping wafer 77 includes an array of vias 50 and also an array of elongate channels 30. These features can be formed in the capping wafer 77 either before or after it is placed on to the semiconductor wafer 22. In other examples, some or all of the elongates channels 30 may pass through the semiconductor wafer 22 instead of the capping wafer 77, or may take the form of trenches or grooves located on the major surface of the semiconductor wafer 22 or an underside of the capping wafer 77. In the case where the capping wafer 77 comprises a glass material such as that described by Cheng et al, laser micro-structuring processes can be used to form the elongate channels 30 and the vias 50. Where the capping wafer 77 comprises a second semiconductor wafer, standard lithographic processes can be used to form the channels 30 and vias 50.

Figure 14B:
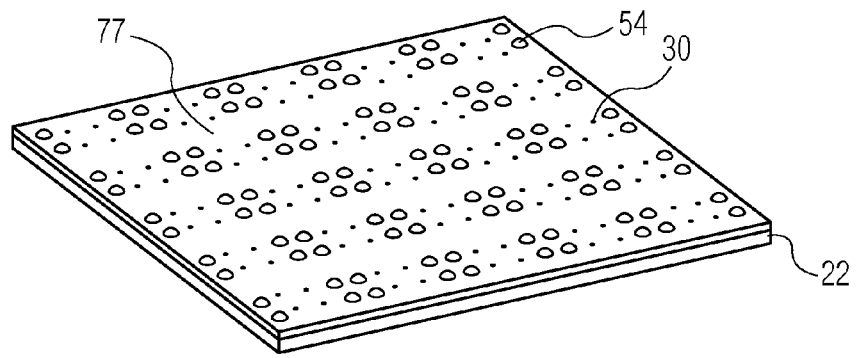
Figure 14C:
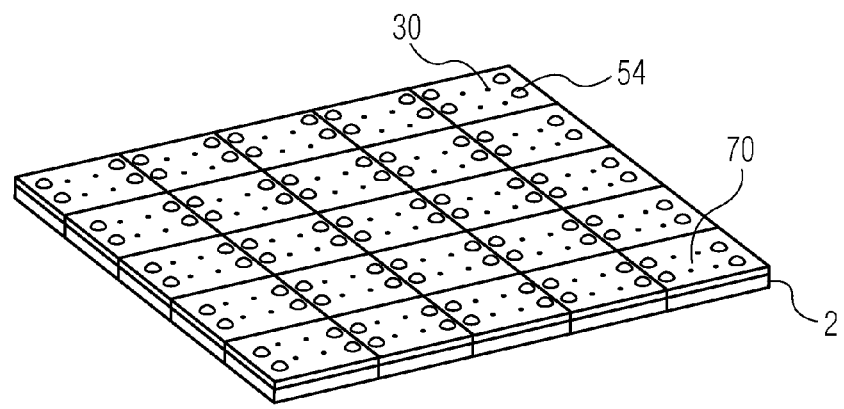

After the capping wafer 77 has been placed on to the semiconductor wafer 22, solder balls 54 can be arranged on the capping wafer 77 in positions corresponding to the vias 50 (FIG. 14B). These solder balls 54 can be heated to allow a portion thereof to sink down through the vias 50 to reach the underlying bond pads on the major surface of the substrate 2. Thereafter, as illustrated in FIG. 14C, the stack comprising the semiconductor wafer 22 and the overlying capping wafer 77 can be singulated to produce a plurality of dice each comprising a semiconductor substrate 2 and cap layers 70. These singulated dice each constitute a chip-scale package of the kind described above in relation to FIGS. 10 and 11.

An integrated circuit of the kind described herein, can, for example, be incorporated into a radio frequency identification (RFID) tag. The sensor can be connected to circuitry of the RFID tag, including features such as an antenna to allow readout of sensing data collected by the sensor. Similarly, an integrated circuit of the kind described herein, may be incorporated into a mobile communications device such as a laptop, tablet or mobile telephone to allow the device to collect data relating to pressure, or other environmental factors, for use in various applications.

It is further envisaged that an integrated circuit of the kind described herein, could be incorporated into a heating, ventilation and air conditioning (HVAC) system. This would allow the HVAC system to collect information relating to pressure (or other environmental factors) in the heating, ventilation or air conditioning of, for example, a building (for example a greenhouse or office building), or a vehicle such as an automobile or an aircraft.

Accordingly, there has been described an integrated circuit and a method of making the same. The integrated circuit includes a semiconductor substrate including at least one environmental sensor. The integrated circuit also includes a cap layer located on a major surface of the substrate. The integrated circuit further includes at least one elongate channel for allowing access of said sensor to an environment surrounding the integrated circuit.

Although particular embodiments of the invention have been described, it will be appreciated that many modifications/additions and/or substitutions may be made within the scope of the claimed invention.

The invention claimed is:

1. An integrated circuit comprising:
a semiconductor substrate including at least one environmental sensor;
a cap layer located on a major surface of the substrate, and
at least one elongate channel for allowing access of said sensor to an environment surrounding the integrated circuit;
wherein the cap layer comprises:
portions that are substantially transparent to allow light to reach an ambient light sensor located in the substrate; and
portions that are substantially opaque to prevent light reaching a temperature sensor located in the substrate.

2. The integrated circuit of claim 1, wherein at least one said elongate channel passes through the cap layer.

3. The integrated circuit of claim 1, wherein at least one said elongate channel passes through the semiconductor substrate.

4. The integrated circuit of claim 1, wherein at least one said elongate channel extends along an interface between the semiconductor substrate and the cap layer.

5. The integrated circuit of claim 1, wherein the cap layer includes at least one cavity that adjoins an area of the major surface in which at least one environmental sensor is located.

6. The integrated circuit of claim 5, wherein the cap layer includes a plurality of said cavities, each cavity adjoining a respective area of the major surface in which at least one environmental sensor is located.

7. The integrated circuit of claim 5, wherein one or more of the cavities(s) is connected to the environment surrounding the integrated circuit by one or more of said elongate channels.

8. The integrated circuit of claim 1 comprising:
a pressure sensor including a deflectable membrane; and
at least one further kind of sensor.

9. The integrated circuit of claim 1, wherein the cap layer comprises a glass.

10. The integrated circuit of claim 1, wherein the cap layer comprises a second semiconductor substrate.

11. The integrated circuit of claim 1, wherein at least some of said elongate channels include one or more corners for inhibiting the incursion of dust.

12. The integrated circuit of claim 1, wherein the semiconductor substrate including the at least one environmental sensor further comprises:
a plurality of CMOS components forming read-out circuitry for the at least one environmental sensor;
a metallization stack for interconnecting the CMOS components and the at least one environmental sensor, and
a passivation stack on the metallization stack,
wherein the at least one environmental sensor is located in or above the metallization stack.

* * * * *